(12) United States Patent
Morita et al.

(10) Patent No.: US 10,886,048 B2
(45) Date of Patent: *Jan. 5, 2021

(54) LAMINATED COIL SUBSTRATE

(71) Applicant: IBIDEN CO., LTD., Ogaki (JP)

(72) Inventors: Haruhiko Morita, Ogaki (JP); Shinobu Kato, Ogaki (JP); Hitoshi Miwa, Ogaki (JP); Hisashi Kato, Ogaki (JP); Toshihiko Yokomaku, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 119 days.

This patent is subject to a terminal disclaimer.

(21) Appl. No.: 16/161,562

(22) Filed: Oct. 16, 2018

(65) Prior Publication Data
US 2019/0115130 A1    Apr. 18, 2019

(30) Foreign Application Priority Data
Oct. 16, 2017  (JP) ................................ 2017-200458

(51) Int. Cl.
*H02K 3/26*       (2006.01)
*H01F 5/00*       (2006.01)
(Continued)

(52) U.S. Cl.
CPC ......... *H01F 5/003* (2013.01); *H01F 27/2804* (2013.01); *H01F 27/2852* (2013.01);
(Continued)

(58) Field of Classification Search
CPC .. H02K 3/00; H02K 3/26; H02K 3/28; H02K 33/18; H05K 1/165; H05K 3/02;
(Continued)

(56) References Cited

U.S. PATENT DOCUMENTS 6,084,515 A * 7/2000 Maitin ............... G08B 13/2411
340/572.3
2005/0285470 A1* 12/2005 Itoh .......................... H02K 3/26
310/208

(Continued)

FOREIGN PATENT DOCUMENTS

JP        2002-289984 A      10/2002

*Primary Examiner* — Tran N Nguyen
(74) *Attorney, Agent, or Firm* — Oblon, McClelland, Maier & Neustadt, L.L.P.

(57) ABSTRACT

A laminated coil substrate includes a printed wiring board including a resin substrate, a first conductor layer on first surface of the substrate and including coils, and a second conductor layer formed on second surface of the substrate on the opposite side and including coils. The printed wiring board includes first, second and third coil substrates that are folded such that the second surface of the substrate in the first and second coil substrates oppose each other and that the first surface of the substrate in the second and third coil substrates oppose each other, the second conductor layer of the printed wiring board includes connection wire on the second surface of the substrate and connecting the first and second coil substrates, and the first conductor layer of the printed wiring board includes connection wire on the first surface of the substrate and connecting the second and third coil substrates.

20 Claims, 6 Drawing Sheets

(51) Int. Cl.
*H02K 33/18* (2006.01)
*H01F 27/28* (2006.01)
*H01F 41/04* (2006.01)
*H05K 1/02* (2006.01)

(52) U.S. Cl.
CPC ............ *H01F 41/041* (2013.01); *H02K 3/26* (2013.01); *H02K 33/18* (2013.01); *H05K 1/028* (2013.01)

(58) Field of Classification Search
CPC .......... H05K 3/10; H05K 3/241; H05K 3/242; H05K 1/028; H01F 27/2852; H01F 27/2804; H01F 5/00; H01F 5/003; H01F 41/041; H01F 41/043; H01F 17/0013
See application file for complete search history.

(56) References Cited

U.S. PATENT DOCUMENTS

| | | | | |
|---|---|---|---|---|
| 2006/0022543 A1* | 2/2006 | Takeuchi | ................. | H02K 3/26 310/179 |
| 2009/0243781 A1* | 10/2009 | Nomura | ................. | H05K 3/242 336/200 |
| 2011/0057536 A1* | 3/2011 | Horng | ..................... | H02K 3/26 310/208 |

* cited by examiner

LAMINATED COIL SUBSTRATE

CROSS-REFERENCE TO RELATED APPLICATIONS

The present application is based upon and claims the benefit of priority to Japanese Patent Application No. 2017-200458, filed Oct. 16, 2017, the entire contents of which are incorporated herein by reference.

BACKGROUND OF THE INVENTION

Field of the Invention

The present invention relates to a laminated coil substrate formed by folding a printed wiring board.

Description of Background Art

Japanese Patent Laid-Open Publication No. 2002-289984 describes a double-sided flexible substrate having circuit patterns on both sides. In Japanese Patent Laid-Open Publication No. 2002-289984, a reinforcing cover lay for reinforcing a circuit pattern is provided at a bent portion. The entire contents of this publication are incorporated herein by reference.

SUMMARY OF THE INVENTION

According to one aspect of the present invention, a laminated coil substrate includes a printed wiring board including a resin substrate, a first conductor layer formed on a first surface of the resin substrate and including coils, and a second conductor layer formed on a second surface of the resin substrate on the opposite side with respect to the first surface and including coils. The printed wiring board includes a first coil substrate, a second coil substrate and a third coil substrate that are folded such that the second surface of the resin substrate in the first coil substrate and the second surface of the resin substrate in the second coil substrate oppose each other and that the first surface of the resin substrate in the second coil substrate and the first surface of the resin substrate in the third coil substrate oppose each other, the second conductor layer of the printed wiring board includes a connection wire formed on the second surface of the resin substrate and connecting the first coil substrate and the second coil substrate, and the first conductor layer of the printed wiring board includes a connection wire formed on the first surface of the resin substrate and connecting the second coil substrate and the third coil substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
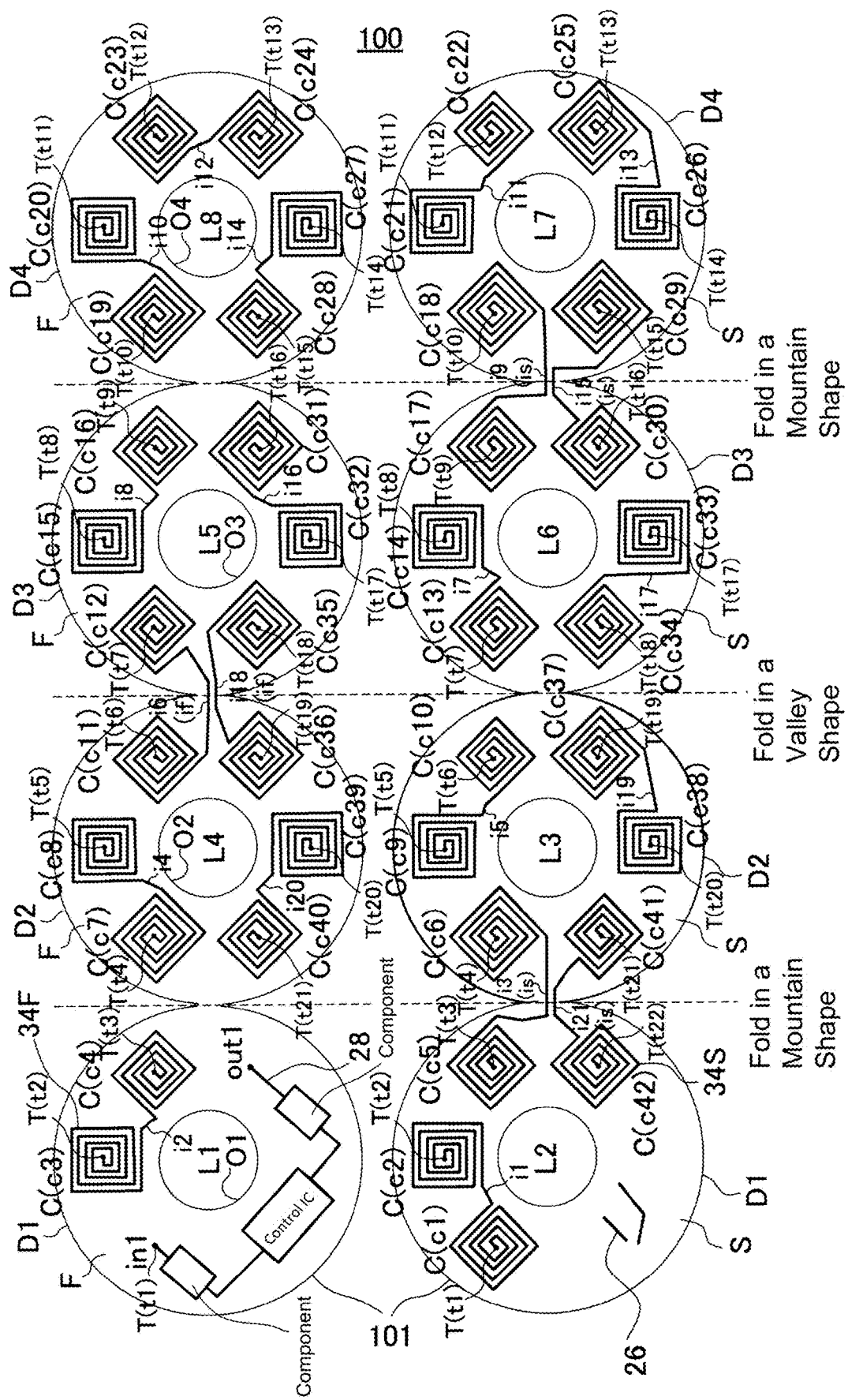
FIG. 1 illustrates a first surface and a second surface of a printed wiring board for forming a laminated coil substrate according to a first embodiment of the present invention.

Embodiments will now be described with reference to the accompanying drawings, wherein like reference numerals designate corresponding or identical elements throughout the various drawings.

First Embodiment

Figure 2:
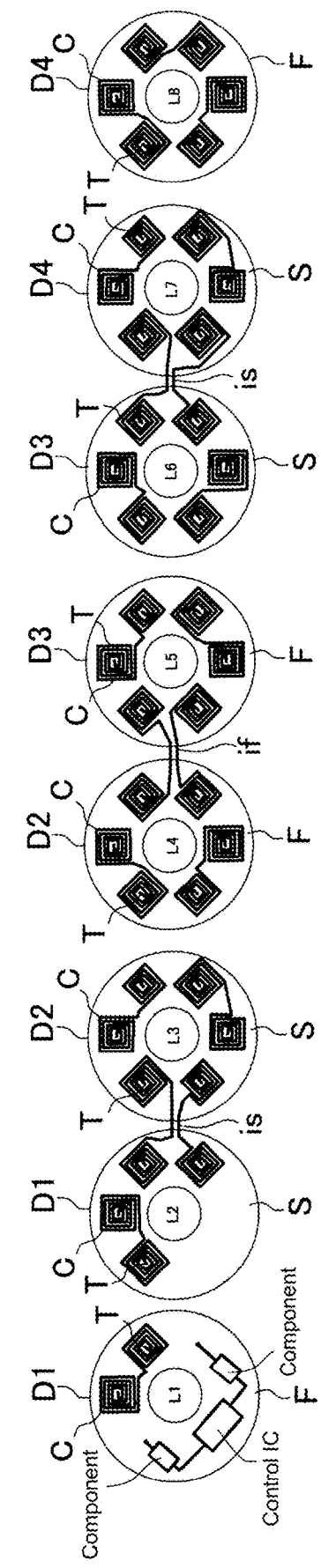
FIG. 2 is a developed view of the laminated coil substrate according to the first embodiment.
Figure 3A:
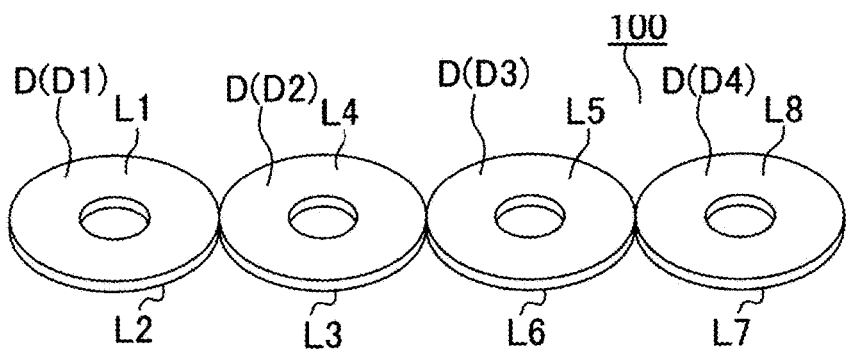
FIG. 3A-3C are schematic diagrams illustrating manufacturing processes of the laminated coil substrate according to the first embodiment.
Figure 3B:
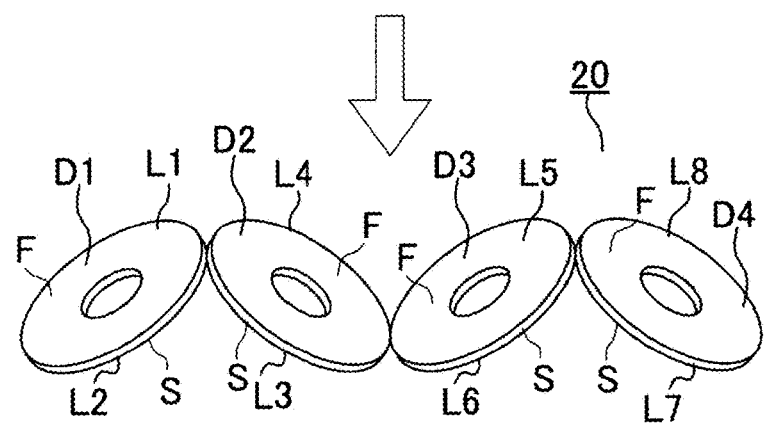
Figure 3C:
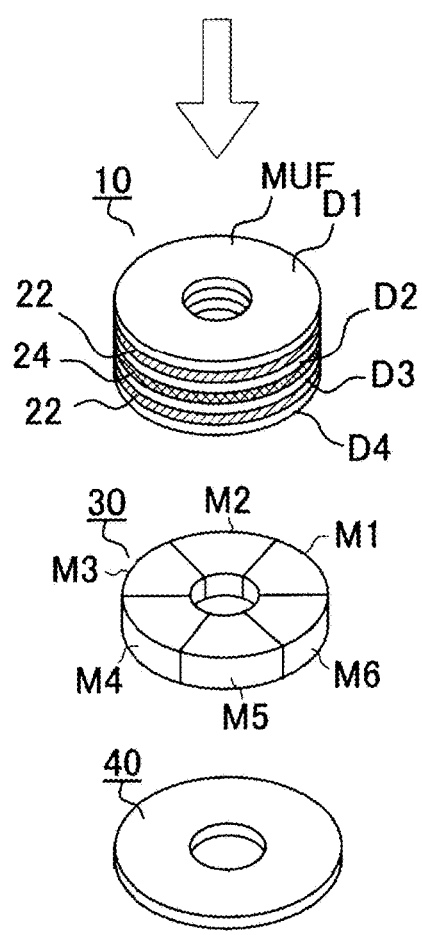

FIG. 3C illustrates a schematic diagram of a laminated coil substrate 10 according to a first embodiment. FIG. 1 illustrates a printed wiring board 100 for forming the laminated coil substrate 10 according to the first embodiment. In FIG. 1, front and back sides of the printed wiring board 100 are depicted. FIG. 2 is a developed view of the laminated coil substrate according to the first embodiment, and FIGS. 3A-3C illustrate a method for manufacturing the laminated coil substrate 10 according to the first embodiment.

The printed wiring board 100 illustrated in FIG. 1 is formed by a resin substrate 101 having a first surface (front side surface) (F) and a second surface (back side surface) (S) on an opposite side with respect to the first surface (F), a first conductor layer (34F) formed on the first surface (F) of the resin substrate 101, and a second conductor layer (34S) formed on the second surface (S) of the resin substrate. The first conductor layer (34F) and the second conductor layer (34S) form coils (C). In FIG. 1, on the left side, the first surface (F) of the resin substrate 101 and the first conductor layer (34F) are depicted; and, on the right side, the second surface (S) of the resin substrate 101 and the second conductor layer (34S) are depicted.

As illustrated in the developed view of FIG. 2, a first surface (F) of a first coil substrate (D1) and a second surface (S) of the first coil substrate (D1) are connected to each other via through-hole conductors (T). The second surface (S) of the first coil substrate (D1) and a second surface (S) of a second coil substrate (D2) are connected to each other via connection wires (intersubstrate connection wires) (is). The second surface (S) of the second coil substrate (D2) and a first surface (F) of the second coil substrate (D2) are connected to each other via through-hole conductors (T). The first surface (F) of the second coil substrate (D2) and a first surface (F) of a third coil substrate (D3) are connected to each other via connection wires (intersubstrate connection wires) (if). The first surface (F) of the third coil substrate (D3) and a second surface (S) of the third coil substrate (D3) are connected to each other via through-hole conductors (T). The second surface (S) of the third coil substrate (D3) and a second surface (S) of a fourth coil substrate (D4) are connected to each other via connection wires (intersubstrate connection wires) (is). The second surface (S) of the fourth coil substrate (D4) and a first surface (F) of the fourth coil substrate (D4) are connected to each other via through-hole conductors (T). In the laminated coil substrate 10, the first surfaces (F) of adjacent coil substrates oppose each other via an adhesive layer 22, and the second surfaces (S) of adjacent coil substrates oppose each other via an adhesive layer 22.

As illustrated in FIG. 3A, the printed wiring board 100 that forms the laminated coil substrate 10 is formed of the multiple coil substrates (D). The number of the coil substrates (D) that form the printed wiring board 100 is preferably an even number. As illustrated in FIG. 3A, adjacent coil substrates are connected to each other. The coil substrates for forming the laminated coil substrate are not individually separated from each other.

In FIG. 3A, the printed wiring board that forms the laminated coil substrate 10 is formed of the four coil substrates (D1, D2, D3, D4). The coil substrates (D1, D2, D3, D4) each have a shape of a disk. The four coil substrates (the first coil substrate (D1), the second coil substrate (D2), the third coil substrate (D3), and the fourth coil substrate (D4)) are connected.

As illustrated in FIG. 1, the coil substrates (D1, D2, D3, D4) each have the first surface (F) and the second surface (S) on an opposite side with respect to the first surface (F).

The coil substrates (D1, D2, D3, D4) each have coils (C) on the first surface (F). The number of the coils (C) formed on the first surface (F) of each of the coil substrates (D) is preferable 2 or more. The number of the coils (C) formed on the first surface (F) of each of the coil substrates (D) is preferable an even number.

The coil substrates (D1, D2, D3, D4) each have coils (C) on the second surface (S).

The number of the coils (C) formed on the second surface (S) of each of the coil substrates (D) is preferably 2 or more. The number of the coils (C) formed on the second surface (S) of each of the coil substrates (D) is preferable an even number. In each of the multiple coil substrates (D), the number of the coils (C) on the first surface (F) and the number of the coils (C) on the second surface (S) are equal to each other.

The coils (C) on the first surface (F) and the coils (C) on the second surface (S) with the resin substrate 101 sandwiched therebetween can be connected to each other by the through-hole conductors (T). The coils (C) on the first surface (F) and the coils (C) on the second surface (S) with the resin substrate 101 sandwiched therebetween are formed symmetrical with respect to the resin substrate 101. The coils (C) on the first surface (F) and the coils (C) on the second surface (S) with the resin substrate 101 sandwiched therebetween are formed plane-symmetrical. In this case, when the coils (C) on the first surface (F) are parallelly moved to the second surface (S), the coils (C) on the first surface (F) respectively overlap the coils (C) on the second surface (S). Further, a direction of a current flowing through the coils (C) on the first surface (F) and a direction of a current flowing through the coils (C) on the second surface (S) are the same.

The laminated coil substrate 10 preferably does not have through-hole conductors (T) connecting adjacent coil substrates to each other. One coil substrate and a coil substrate laminated directly on the one coil substrate are not connected to each other by through-hole conductors (T). One coil substrate and a coil substrate laminated directly below the one coil substrate are not connected to each other by through-hole conductors (T).

A laminated coil substrate 10 having a high inductance can be provided. For example, the first coil substrate (D1) and the second coil substrate (D2) are not connected to each other by through-hole conductors (T). Similarly, the second coil substrate (D2) and the third coil substrate (D3) are not connected to each other by through-hole conductors (T).

As illustrated in FIG. 1, the printed wiring board 100 for forming the laminated coil substrate 10 has the intersubstrate connection wires (if, is). One coil substrate and another coil substrate connected to the one coil substrate are connected to each other by the intersubstrate connection wires (if, is). Adjacent coil substrates are connected to each other by the intersubstrate connection wires (if, is). One coil substrate and another coil substrate are adjacent to each other. The intersubstrate connection wires (if, is) each extend from one coil substrate to another coil substrate. The intersubstrate connection wires (if) are each formed on the first surface (F) of one coil substrate and the first surface (F) of another coil substrate. The intersubstrate connection wires (is) are each formed on the second surface (S) of one coil substrate and the second surface (S) of another coil substrate. As illustrated in FIG. 1, adjacent coil substrates are connected to each other by multiple intersubstrate connection wires. The number of the intersubstrate connection wires (if, is) connecting adjacent coil substrates to each other is preferably 2.

One coil substrate and another coil substrate laminated directly on the one coil substrate are connected to each other by the intersubstrate connection wires (if, is). The number of the intersubstrate connection wires (if, is) connecting to each other one coil substrate and another coil substrate laminated directly on the one coil substrate is preferably 2.

One coil substrate and another coil substrate laminated directly below the one coil substrate are connected to each other by the intersubstrate connection wires (if, is). The number of the intersubstrate connection wires (if, is) connecting to each other one coil substrate and another coil substrate laminated directly below the one coil substrate is preferably 2.

Adjacent coil substrates are preferably connected to each other only by the intersubstrate connection wires (if, is). One coil substrate and another coil substrate laminated directly on the one coil substrate are connected to each other only by the intersubstrate connection wires (if, is). One coil substrate and another coil substrate laminated directly below the one coil substrate are connected to each other only by the intersubstrate connection wires (if, is).

FIG. 3A-3C are conceptual diagrams illustrating a method for manufacturing the laminated coil substrate 10 of the first embodiment. As illustrated in FIG. 3A, the printed wiring board 100 having the multiple coil substrates (D1, D2, D3, D4) is prepared. The first surfaces (F) of the coil substrates forming the printed wiring board 100 are facing in the same direction. As illustrated in FIG. 3A, the first surfaces (F) of all of the coil substrates are facing in the same direction. The second surface (S) of the coil substrates forming the printed wiring board 100 are facing in the same direction. As illustrated in FIG. 3A, the second surfaces (S) of all of the coil substrates are facing in the same direction. In FIG. 3A, the first surface (F) of the first coil substrate (D1), the first surface (F) of the second coil substrate (D2), the first surface (F) of the third coil substrate (D3), and the first surface (F)

of the fourth coil substrate (D4) are facing upward. The second surface (S) of the first coil substrate (D1), the second surface (S) of the second coil substrate (D2), the second surface (S) of the third coil substrate (D3), and the second surface (S) of the fourth coil substrate (D4) are facing downward.

Then, as illustrated in FIG. 3B, the printed wiring board 100 is folded such that adjacent coil substrates (D) overlap each other. Adjacent coil substrates (D) are folded between the adjacent coil substrates (D). In this case, the printing wiring board 100 is folded such that an adhesive layer 22 is sandwiched between each pair of adjacent coil substrates (D). By folding the printed wiring board 100 having the intersubstrate connection wires (if, is), the laminated coil substrate 10 is formed. Therefore, the laminated coil substrate 10 does not have to have through-hole conductors (T) for connecting adjacent coil substrates to each other.

By folding the printed wiring board 100, the laminated coil substrate 10 illustrated in FIG. 3C is formed. Coils (C) opposing each other via an adhesive layer 22 are connected to each other by intersubstrate connection wires (if, is). A through-hole conductor (T) or a via conductor for connecting to each other coils (C) that oppose each other via an adhesive layer 22 is not required. It is unnecessary to form a through-hole conductor or a via conductor in an adhesive layer 22. A through-hole conductor penetrating an adhesive layer 22 is not required. Adhesion strength via the adhesive layer 22 can be increased. Since the printed wiring board 100 is folded, the first surfaces (F) of the coil substrates are not facing in the same direction. The second surfaces (S) of the coil substrates are not facing in the same direction. In FIG. 3C, the first surface (F) of the first coil substrate (D1) is facing upward, the first surface (F) of the second coil substrate (D2) is facing downward, the first surface (F) of the third coil substrate (D3) is facing upward, and the first surface (F) of the fourth coil substrate (D4) is facing downward. The second surface (S) of the first coil substrate (D1) is facing downward, the second surface (S) of the second coil substrate (D2) is facing upward, the second surface (S) of the third coil substrate (D3) is facing downward, and the second surface (S) of the fourth coil substrate (D4) is facing upward. In the laminated coil substrate 10, the first surface (F) of one coil substrate and the first surface (F) of another coil substrate oppose each other via an adhesive layer 22, and the second surface (S) of one coil substrate and the second surface (S) of another coil substrate oppose each other via an adhesive layer 22.

In the example of FIG. 3B, the first coil substrate (D1) and the second coil substrate (D2) are folded between the first coil substrate (D1) and the second coil substrate (D2). The second coil substrate (D2) and the third coil substrate (D3) are folded between the second coil substrate (D2) and the third coil substrate (D3). The third coil substrate (D3) and the fourth coil substrate (D4) are folded between the third coil substrate (D3) and the fourth coil substrate (D4). As a result, the laminated coil substrate 10 illustrated in FIG. 3C is formed. In FIG. 3B, the first coil substrate (D1) and the second coil substrate (D2) are folded in a mountain shape such that the second surface (S) of the first coil substrate (D1) and the second surface (S) of the second coil substrate (D2) oppose each other, the second coil substrate (D2) and the third coil substrate (D3) are folded in a valley shape such that the first surface (F) of the second coil substrate (D2) and the first surface (F) of the third coil substrate (D3) oppose each other, and the third coil substrate (D3) and the fourth coil substrate (D4) are folded in a mountain shape such that the second surface (S) of the third coil substrate (D3) and the second surface (S) of the fourth coil substrate (D4) oppose each other.

Figure 5A:
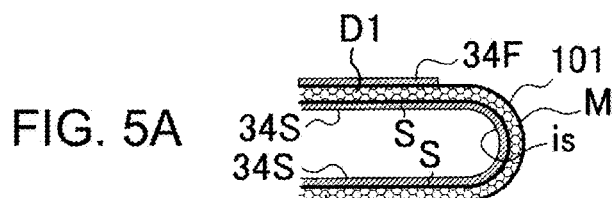
FIG. 5A illustrates a bent portion between the first coil substrate and the second coil substrate which are folded in a mountain shape.
Figure 5B:
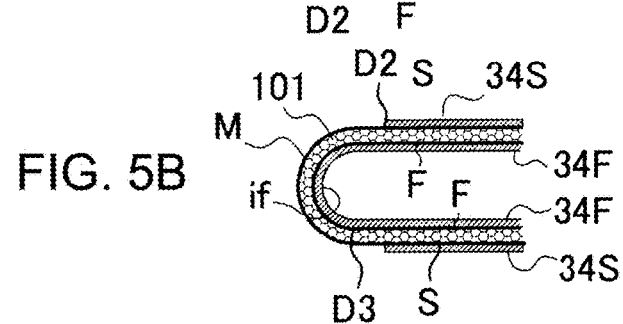
FIG. 5B illustrates a bent portion between the second coil substrate and the third coil substrate which are folded in a valley shape.
Figure 5C:
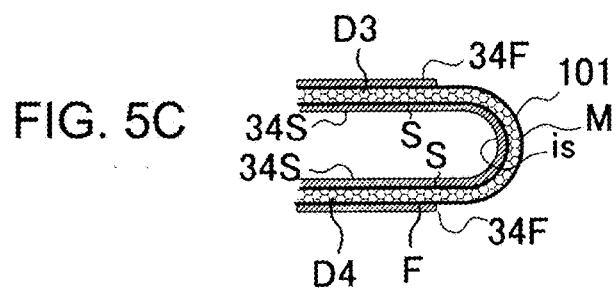
FIG. 5C illustrates a bent portion between the third coil substrate and the fourth coil substrate which are folded in a mountain shape.
Figure 5D:
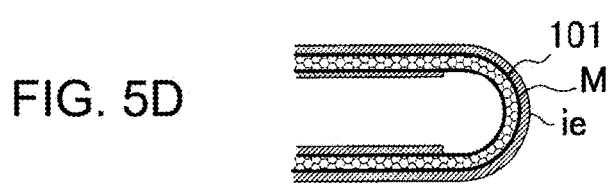
FIG. 5D illustrates a reference example in which an intersubstrate connection wire is formed on an outer side of a bent portion.

FIG. 5A illustrates a bent portion (M) between the first coil substrate (D1) and the second coil substrate (D2) which are folded in a mountain shape. The resin substrate 101 is folded such that the second surface (S) of the first coil substrate (D1) and the second surface (S) of the second coil substrate (D2) oppose each other, and the intersubstrate connection wires (is) between the first coil substrate (D1) and the second coil substrate (D2) are formed on the second surface, that is, on an inner side of the folded resin substrate 101. Therefore, a stress received by the intersubstrate connection wires (is) when being folded is small, and a disconnection is unlikely to occur. FIG. 5B illustrates a bent portion (M) between the second coil substrate (D2) and the third coil substrate (D3) which are folded in a valley shape. The resin substrate 101 is folded such that the first surface (F) of the second coil substrate (D2) and the first surface (F) of the third coil substrate (D3) oppose each other, and the intersubstrate connection wires (if) between the second coil substrate (D2) and the third coil substrate (D3) are formed on the first surface, that is, on an inner side of the folded resin substrate 101. Therefore, a stress received by the intersubstrate connection wires (if) when being folded is small, and a disconnection is unlikely to occur. FIG. 5C illustrates a bent portion (M) between the third coil substrate (D3) and the fourth coil substrate (D4) which are folded in a mountain shape. The resin substrate 101 is folded such that the second surface (S) of the third coil substrate (D3) and the second surface (S) of the fourth coil substrate (D4) oppose each other, and the intersubstrate connection wires (is) between the third coil substrate (D3) and the fourth coil substrate (D4) are formed on the second surface, that is, on an inner side of the folded resin substrate 101. Therefore, a stress received by the intersubstrate connection wires (is) when being folded is small, and a disconnection is unlikely to occur. FIG. 5D illustrates a reference example in which an intersubstrate connection wire (ie) is formed on an outer side of a bent portion (M). The intersubstrate connection wire (ie) is formed on an outer side of the folded resin substrate 101. Therefore, the intersubstrate connection wire (ie) receives a large stress when being folded, and a disconnection is likely to occur.

Figure 5E:
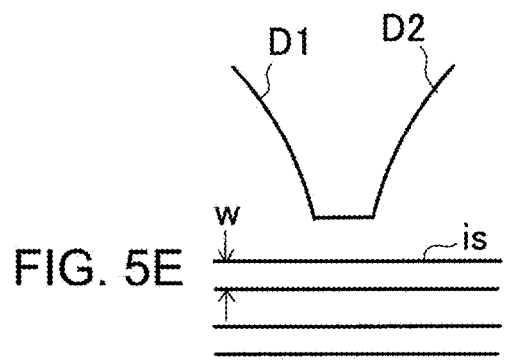
FIG. 5E illustrates a line width of an intersubstrate connection wire.
Figure 5F:
FIG. 5F illustrates a modified example of the intersubstrate connection wires.

FIG. 5E illustrates a line width (w) of an intersubstrate connection wire (is). The intersubstrate connection wires (if, is) desirably each have a line width (w) of 45 μm or more and 500 μm or less. When the line width (w) is 45 μM or less, a disconnection is likely to occur. On the other hand, when the line width (w) exceeds 500 μm, as in the reference example illustrated in FIG. 5D, even when an intersubstrate connection wire is formed on an outer side of the folded resin substrate 101, since rigidity is high, a disconnection does not occur. A thickness is preferably 30 μm or more. FIG. 5F illustrates a modified example of the intersubstrate connection wires (is). For each of the intersubstrate connection wires (is), the width is increased to a width (w2) of 45 μm or more at a connecting part between the first coil substrate (D1) and the second coil substrate (D2) and is reduced to a width (w1) of less than 45 μm inside the first coil substrate (D1) and the second coil substrate (D2).

The laminated coil substrate 10 of the first embodiment is used, for example, as a coil of a fan motor of a computer. Adjacent coil substrates are bonded to each other by an adhesive layer 22. The coil substrates (D) are folded such that an adhesive layer 22 is sandwiched between each pair of adjacent coil substrates. At least one of the adhesive layers 22 is formed of a magnetic sheet 24. It is unnecessary to form a through-hole conductor or a via conductor in the magnetic sheet 24. For example, magnetic flux can be increased.

In the example of FIG. 3C, the adhesive layer 22 between the first coil substrate (D1) and the second coil substrate (D2) is not magnetic. The adhesive layer 22 between the third coil substrate (D3) and the fourth coil substrate (D4) is not magnetic. The adhesive layer 22 between the second coil substrate (D2) and the third coil substrate (D3) is magnetic. That is, the adhesive layer 22 positioned at substantially a center in a thickness direction of the laminated coil substrate is magnetic. A magnetic adhesive layer 22 is a magnetic sheet 24. A non-magnetic adhesive layer 22 is formed of, for example, epoxy. A magnetic sheet may contain magnetic particles. For example, the magnetic sheet 24 is formed by mixing magnetic particles in epoxy. Examples of the magnetic particles include iron (III) oxide particles, cobalt iron oxide particles, iron particles, magnetic alloy particles, ferrite particles, and the like.

As illustrated in FIG. 1, a first coil layer (L1) having the coils (C) is formed on the first surface (F) of the first coil substrate (D1). In addition to the coils (C), the first coil layer (L1) has a wiring 28 including a pad for mounting an IC chip. A second coil layer (L2) having the coils (C) is formed on the second surface (S) of the first coil substrate (D1). In addition to the coils (C), the second coil layer (L2) has a wiring 26. A fourth coil layer (L4) having the coils (C) is formed on the first surface (F) of the second coil substrate (D2), and a third coil layer (L3) having the coils (C) is formed on the second surface (S) of the second coil substrate (D2). A fifth coil layer (L5) having the coils (C) is formed on the first surface (F) of the third coil substrate (D3), and a sixth coil layer (L6) having the coils (C) is formed on the second surface (S) of the third coil substrate (D3). An eighth coil layer (L8) having the coils (C) is formed on the first surface (F) of the fourth coil substrate (D4), and a seventh coil layer (L7) having the coils (C) is formed on the second surface (S) of the fourth coil substrate (D4).

In the example of FIG. 1, the first coil layer (L1) has a third coil (c3) and a fourth coil (c4).

The second coil layer (L2) has a first coil (c1), a second coil (c2), a fifth coil (c5) and a forty-second coil (c42).

The third coil layer (L3) has a sixth coil (c6), a ninth coil (c9), a tenth coil (c10), a thirty-seventh coil (c37), a thirty-eighth coil (c38), and a forty-first coil (c41).

The fourth coil layer (L4) has a seventh coil (c7), an eighth coil (c8), an eleventh coil (c11), a thirty-sixth coil (c36), a thirty-ninth coil (c39), and a fortieth coil (c40).

The fifth coil layer (L5) has a twelfth coil (c12), a fifteenth coil (c15), a sixteenth coil (c16), a thirty-first coil (c31), a thirty-second coil (c32), and a thirty-fifth coil (c35).

The sixth coil layer (L6) has a thirteenth coil (c13), a fourteenth coil (c14), a seventeenth coil (c17), a thirtieth coil (c30), a thirty-third coil (c33), and a thirty-fourth coil (c34).

The seventh coil layer (L7) has an eighteenth coil (c18), a twenty-first coil (c21), a twenty-second coil (c22), a twenty-fifth coil (c25), a twenty-sixth coil (c26), and a twenty-ninth coil (c29).

The eighth coil layer (L8) has a nineteenth coil (c19), a twentieth coil (c20), a twenty-third coil (c23), a twenty-fourth coil (c24), a twenty-seventh coil (c27), and a twenty-eighth coil (c28).

In this way, multiple coils (C) are formed on the first surface (F) of each of the coil substrates (D). The number of the coils (C) formed on the first surface (F) of each of the coil substrates (D) is an even number. Multiple coils (C) are formed on the second surface (S) of each of the coil substrates (D). The number of the coils (C) formed on the second surface (S) of each of the coil substrates (D) is an even number.

It is possible to remove, for example, the first coil (c1), the second coil (c2) and the third coil (c3) from the example of FIG. 1.

It is possible to remove, for example, the third coil substrate (D3) and the fourth coil substrate (D4) from the example of FIG. 1. In this case, the coils (C) from the tenth coil (c10) to the thirty-seventh coil (c37) are removed. Then, the ninth coil (c9) and the thirty-eighth coil (c38) are connected to each other by a connection wire (i).

In the example of FIG. 1, the first coil layer (L1) has two coils (C). The second coil layer (L2) has four coils (C). The third coil layer (L3), the fourth coil layer (L4), the fifth coil layer (L5), the sixth coil layer (L6), the seventh coil layer (L7) and the eighth coil layer (L8) each have six coils (C). In this way, the coil layers (L1, L2, L3, L4, L5, L6, L7, L8) each have multiple coils (C). The number of the coils (C) formed in each of the coil layers (L1, L2, L3, L4, L5, L6, L7, L8) is an even number. The numbers of the coils (C) formed in the coil layers (L1, L2, L3, L4, L5, L6, L7, L8) do not completely match each other.

One coil and other coils formed in the laminated coil substrate 10 can be connected to each other by the through-hole conductors (T) and the connection wires (connection wirings) (i).

In the example of FIG. 1, the first coil (c1) and the second coil (c2) are connected to each other by a first connection wire (i1). The second coil (c2) and the third coil (c3) are connected to each other by a second through-hole conductor (t2). The third coil (c3) and the fourth coil (c4) are connected to each other by a second connection wire (i2). The fourth coil (c4) and the fifth coil (c5) are connected to each other by a third through-hole conductor (t3). The fifth coil (c5) and the sixth coil (c6) are connected to each other by a third connection wire (i3) (is). The sixth coil (c6) and the seventh coil (c7) are connected to each other by a fourth through-hole conductor (t4). The seventh coil (c7) and the eighth coil (c8) are connected to each other by a fourth connection wire (i4). The eighth coil (c8) and the ninth coil (c9) are connected to each other by a fifth through-hole conductor (t5). The ninth coil (c9) and the tenth coil (c10) are connected to each other by a fifth connection wire (i5). The tenth coil (c10) and the eleventh coil (c11) are connected to each other by a sixth through-hole conductor (t6). The eleventh coil (c11) and the twelfth coil (c12) are connected to each other by a sixth connection wire (i6) (if). The twelfth coil (c12) and the thirteenth coil (c13) are connected to each other by a seventh through-hole conductor (t7). The thirteenth coil (c13) and the fourteenth coil (c14) are connected to each other by a seventh connection wire (i7). The fourteenth coil (c14) and the fifteenth coil (c15) are connected to each other by an eighth through-hole conductor (t8). The fifteenth coil (c15) and the sixteenth coil (c16) are connected to each other by an eighth connection wire (i8). The sixteenth coil (c16) and the seventeenth coil (c17) are connected to each other by a ninth through-hole conductor (t9). The seventeenth coil (c17) and the eighteenth coil (c18) are connected to each other by a ninth connection wire (i9) (is). The eighteenth coil (c18) and the nineteenth coil (c19) are connected to each other by a tenth through-hole conductor (t10). The nineteenth coil (c19) and the twentieth coil (c20) are connected to each other by a tenth connection wire (i10). The twentieth coil (c20) and the twenty-first coil (c21) are connected to each other by an eleventh through-hole conductor (t11). The twenty-first coil (c21) and the twenty-second coil (c22) are connected to each other by an eleventh connection wire (i11). The twenty-second coil (c22) and the twenty-third coil (c23) are connected to each other by a twelfth through-hole conductor (t12). The twenty-third coil (c23) and the twenty-fourth coil (c24) are connected to each other by a twelfth connection wire (i12). The twenty-fourth coil (c24) and the twenty-fifth coil (c25) are connected to each other by a thirteenth through-hole conductor (t13). The twenty-fifth coil (c25) and the twenty-sixth coil (c26) are connected to each other by a thirteenth connection wire (i13). The twenty-sixth coil (c26) and the twenty-seventh coil (c27) are connected to each other by a fourteenth through-hole conductor (t14). The twenty-seventh coil (c27) and the twenty-eighth coil (c28) are connected to each other by a fourteenth connection wire (i14). The twenty-eighth coil (c28) and the twenty-ninth coil (c29) are connected to each other by a fifteenth through-hole conductor (t15). The twenty-ninth coil (c29) and the thirtieth coil (c30) are connected to each other by a fifteenth connection wire (i15) (is). The thirtieth coil (c30) and the thirty-first coil (c31) are connected to each other by a sixteenth through-hole conductor (t16). The thirty-first coil (c31) and the thirty-second coil (c32) are connected to each other by a sixteenth connection wire (i16). The thirty-second coil (c32) and the thirty-third coil (c33) are connected to each other by a seventeenth through-hole conductor (t17). The thirty-third coil (c33) and the thirty-fourth coil (c34) are connected to each other by a seventeenth connection wire (i17). The thirty-fourth coil (c34) and the thirty-fifth coil (c35) are connected to each other by an eighteenth through-hole conductor (t18) (if). The thirty-fifth coil (c35) and the thirty-sixth coil (c36) are connected to each other by an eighteenth connection wire (i18). The thirty-sixth coil (c36) and the thirty-seventh coil (c37) are connected to each other by a nineteenth through-hole conductor (t19). The thirty-seventh coil (c37) and the thirty-eighth coil (c38) are connected to each other by a nineteenth connection wire (i19). The thirty-eighth coil (c38) and the thirty-ninth coil (c39) are connected to each other by a twentieth through-hole conductor (t20). The thirty-ninth coil (c39) and the fortieth coil (c40) are connected to each other by a twentieth connection wire (i20). The fortieth coil (c40) and the forty-first coil (c41) are connected to each other by a twenty-first through-hole conductor (t21). The forty-first coil (c41) and the forty-second coil (c42) are connected to each other by a twenty-first connection wire (i21) (is).

In this way, the coil layer on the first surface (F) and the coil layer on the second surface (S) formed in one coil substrate (D) are connected to each other by the through-hole conductors (T). The connection between the coils (C) on the first surface (F) formed in one coil substrate (D) is performed with the connection wires (i). The connection between the coils (C) on the second surface (S) formed in one coil substrate (D) is performed with the connection wires (i). Coils formed on one coil substrate and coils formed on another coil substrate are connected to each other by the intersubstrate connection wires (if, is). All of the coils (C) are connected to each other via the through-hole conductors (T), the connection wires (i), and the intersubstrate connection wires (if, is).

In the example of FIG. 1, the first coil substrate (D1) and the second coil substrate (D2) are connected to each other by the connection wires (i3 (intersubstrate connection wire (is)), i21 (intersubstrate connection wire (is))). The coil (fifth coil (c5)) formed on the first coil substrate (D1) and the coil (sixth coil (c6)) formed on the second coil substrate (D2) are connected to each other by the connection wire (third connection wire (i3) intersubstrate connection wire (is))). The coil (forty-second coil (c42)) formed on the first coil substrate (D1) and the coil (forty-first coil (c41)) formed on the second coil substrate (D2) are connected to each other by the connection wire (twenty-first connection wire (i21) (intersubstrate connection wire (is))).

The second coil substrate (D2) and the third coil substrate (D3) are connected to each other by the connection wires (i6 (intersubstrate connection wire (if)), i18 (intersubstrate connection wire (if))). The coil (eleventh coil (c11)) formed on the second coil substrate (D2) and the coil (twelfth coil (c12)) formed on the third coil substrate (D3) are connected to each other by the connection wire (sixth connection wire (i6) (intersubstrate connection wire (if))). The coil (thirty-sixth coil (c36)) formed on the second coil substrate (D2) and the coil (thirty-fifth coil (c35)) formed on the third coil substrate (D3) are connected to each other by the connection wire (eighteenth connection wire (i18) (intersubstrate connection wire (if))).

The third coil substrate (D3) and the fourth coil substrate (D4) are connected to each other by the connection wires (i9 (intersubstrate connection wire (is)), i15 (intersubstrate connection wire (is))). The coil (seventeenth coil (c17)) formed on the third coil substrate (D3) and the coil (eighteenth coil (c18)) formed on the fourth coil substrate (D4) are connected to each other by the connection wire (ninth connection wire (i9) (intersubstrate connection wire (is))). The coil (thirtieth coil (c30)) formed on the third coil substrate (D3) and the coil (twenty-ninth coil (c29)) formed on the fourth coil substrate (D4) are connected to each other by the connection wire (fifteenth connection wire (i15) (intersubstrate connection wire (is))).

Coils (C) on one coil substrate and coils (C) on another coil substrate are connected to each other by the intersubstrate connection wires (if, is) extending from the one coil substrate to the other coil substrate. A connection wire formed on the first surface (F) is an intersubstrate connection wire (if), and a connection wire formed on the second surface (S) is an intersubstrate connection wire (is).

The coils (C) are preferably planar coils. The coils (C) preferably each have a spiral shape.

The coils (C) are respectively connected to the through-hole conductors (T) at central portions of the coils. The coils (C) are respectively coils formed around the through-hole conductors (T). The through-hole conductors (T) are respectively formed at the central portions of the coils (C). Further, the coils (C) are respectively connected to the connection wires (i) at outer peripheral portions of the coils.

When a coil (C) on the first surface (F) and a coil (C) on the second surface (S) are directly connected to each other via a through-hole conductor (T), the coil (C) on the first surface (F) is referred to as a first vertical connection coil, and the coil (C) on the second surface (S) is referred to as a second vertical connection coil. The first vertical connection coil and the second vertical connection coil are symmetrically formed with respect to the resin substrate 101. A winding direction of the first vertical connection coil and a winding direction of the second vertical connection coil are the same. For example, magnetic flux can be increased.

A direction of a current flowing through the first vertical connection coil and a direction of a current flowing through the second vertical connection coil are the same. For example, magnetic flux can be increased. The winding directions and the current directions are observed from a position above the first surface (F) of the printed wiring board 100. The third coil (c3) of FIG. 1 and the second coil (c2) of FIG. 1 are directly connected to each other by the second through-hole conductor (t2). The winding direction of the third coil (c3) and the winding direction of the second coil (c2) are counterclockwise. A direction of a current flowing through the first vertical connection coil and a direction of a current flowing through the second vertical connection coil are the same. The direction of the current flow is observed from a position above the first surface (F) of the printed wiring board 100.

When two coils are directly connected to each other via a connection wire (i), one coil is referred to as a first planar connection coil and the other coil is referred to as a second planar connection coil. When a first planar connection coil and a second planar connection coil are connected to each other by an intersubstrate connection wire (if, is), the winding direction of the first planar connection coil and the winding direction of the second planar connection coil are opposite to each other. The eleventh coil (c11) of FIG. 1 and the twelfth coil (c12) of FIG. 1 are connected to each other by the sixth connection wire (i6). The sixth connection wire (i6) is an intersubstrate connection wire (if). The winding direction of the eleventh coil (c11) is counterclockwise, and the winding direction of the twelfth coil (c12) is clockwise. The winding directions and the current directions are observed from a position above the first surface (F) of the printed wiring board 100. When the laminated coil substrate 10 is manufactured from the printed wiring board 100, the winding directions of two coils sandwiching an adhesive layer 22 are the same. For example, when the coils are observed from a position above an uppermost surface (MUF) of the laminated coil substrate 10, the eleventh coil (c11) and the twelfth coil (c12) in the laminated coil substrate 10 face each other via the adhesive layer 22. When the winding directions of the coils are observed from a position above the uppermost surface (MUF) (the first surface (F) of the first coil substrate (D1)) of the laminated coil substrate 10, the winding direction of the eleventh coil (c11) in the laminated coil substrate is counterclockwise, and the winding direction of the twelfth coil (c12) in the laminated coil substrate is counterclockwise. For example, magnetic flux can be increased.

When a first planar connection coil and a second planar connection coil are connected to each other by an intersubstrate connection wire (if, is), the direction of the current flowing through the first planar connection coil and the direction of the current flowing through the second planar connection coil are opposite to each other. For example, the current flows counterclockwise through the eleventh coil (c11). The current flows clockwise through the twelfth coil (c12). The direction of the current flow is observed from a position above the first surface (F) of the printed wiring board 100. When the laminated coil substrate 10 is manufactured from the printed wiring board 100, the directions of the currents flowing through two coils sandwiching an adhesive layer 22 are the same. For example, when the coils are observed from a position above an uppermost surface (MUF) of the laminated coil substrate 10, the eleventh coil (c11) and the twelfth coil (c12) in the laminated coil substrate 10 face each other via the adhesive layer 22. When the current directions are observed from a position above the uppermost surface (MUF) (the first surface (F) of the first coil substrate (D1)) of the laminated coil substrate 10, the current flows counterclockwise through the eleventh coil (c11) in the laminated coil substrate and flows counterclockwise through the twelfth coil (c12) in the laminated coil substrate. For example, magnetic flux can be increased.

When a first planar connection coil and a second planar connection coil are connected to each other by a connection wire (i), the winding direction of the first planar connection coil and the winding direction of the second planar connection coil are opposite to each other. For example, the seventh coil (c7) of FIG. 1 and the eighth coil (c8) of FIG. 1 are connected to each other by the fourth connection wire (i4). The winding direction of the seventh coil (c7) is counterclockwise, and the winding direction of the eighth coil (c8) is clockwise. The fifteenth coil (c15) of FIG. 1 and the sixteenth coil (c16) of FIG. 1 are connected to each other by the eighth connection wire (i8). The winding direction of the fifteenth coil (c15) is counterclockwise, and the winding direction of the sixteenth coil (c16) is clockwise. The winding directions are observed from a position above the first surface (F) of the printed wiring board 100. When the laminated coil substrate 10 is manufactured from the printed wiring board 100, the winding directions of two coils sandwiching an adhesive layer 22 are the same. For example, when the coils are observed from a position above the uppermost surface (MUF) (for example, the first surface (F) of the first coil substrate) of the laminated coil substrate 10, the seventh coil (c7) and the sixteenth coil (c16) in the laminated coil substrate 10 face each other via the adhesive layer 22. The eighth coil (c8) and the fifteenth coil (c15) face each other via the adhesive layer 22. Then, when the winding directions of the coils are observed from a position above the uppermost surface (MUF) (for example, the first surface (F) of the first coil substrate) of the laminated coil substrate 10, the winding direction of the seventh coil (c7) and the winding direction of the sixteenth coil (c16) are the same. The winding directions of both the seventh coil (c7) and the sixteenth coil (c16) are clockwise. The winding direction of the eighth coil (c8) and the winding direction of the fifteenth coil (c15) are the same. The winding directions of both the eighth coil (c8) and the fifteenth coil (c15) are counterclockwise. By folding the printed wiring board 100, the winding directions of coils opposing each other via an adhesive layer 22 are the same. For example, magnetic flux can be increased.

When a first planar connection coil and a second planar connection coil are connected to each other by a connection wire (i), the direction of the current flowing through the first planar connection coil and the direction of the current flowing through the second planar connection coil are opposite to each other. For example, the seventh coil (c7) of FIG. 1 and the eighth coil (c8) of FIG. 1 are connected to each other by the fourth connection wire (i4). The direction of the current flowing through the seventh coil (c7) is counterclockwise, and the direction of the current flowing through the eighth coil (c8) is clockwise. The fifteenth coil (c15) of FIG. 1 and the sixteenth coil (c16) of FIG. 1 are connected to each other by the eighth connection wire (i8). The direction of the current flowing through the fifteenth coil (c15) is counterclockwise, and the direction of the current flowing through the sixteenth coil (c16) is clockwise. The directions of the currents flowing through the coils are observed from a position above the first surface (F) of the printed wiring board 100. When the laminated coil substrate 10 is manufactured from the printed wiring board 100, the directions of the currents flowing through the two coils sandwiching an adhesive layer 22 are the same. For example, when the coils are observed from a position above the uppermost surface (MUF) (for example, the first surface (F) of the first coil substrate) of the laminated coil substrate 10, the seventh coil (c7) and the sixteenth coil (c16) in the laminated coil substrate 10 face each other via the adhesive layer 22. The eighth coil (c8) and the fifteenth coil (c15) face each other via the adhesive layer 22. Then, when the current directions are observed from a position above the uppermost surface (MUF) (for example, the first surface (F) of the first coil substrate) of the laminated coil substrate 10, the direction of the current flowing through the seventh coil (c7) and the direction of the current flowing through the sixteenth coil (c16) are the same. The direction of the current flowing through the seventh coil (c7) and the direction of the current flowing through the sixteenth coil (c16) are clockwise. The direction of the current flowing through the eighth coil (c8) and the direction of the current flowing through the fifteenth coil (c15) are the same. The direction of the current flowing through the eighth coil (c8) and the direction of the current flowing through the fifteenth coil (c15) are counterclockwise. By folding the printed wiring board 100, the directions of the currents flowing through two coils opposing each other via an adhesive layer 22 are the same. For example, magnetic flux can be increased.

The winding directions of the coils (C) and the directions of the currents flowing through the coils (C) in the laminated coil substrate 10 are observed from a position above the uppermost surface (MUF) of the laminated coil substrate 10.

A flow direction of a current flowing though the printed wiring board 100 illustrated in FIG. 1 is described next.

A current (input current) from an input (in1) formed on the first surface (F) of the first coil substrate (D1) reaches the first coil (c1) via a first through-hole conductor (W). Thereafter, the input current flows through the first coil (c1). The input current flows from the central portion of the first coil (c1) which is formed in a spiral shape toward outside. The winding direction of the first coil (c1) is clockwise. The input current flows clockwise through the first coil (c1). Thereafter, the input current reaches the second coil (c2) via the first connection wire (i1). The first connection wire (i1) is formed on the second surface (S) of the first coil substrate (D1). Thereafter, the input current flows through the second coil (c2) and reaches the second through-hole conductor (t2) formed at the central portion of the second coil (c2). In the second coil (c2), the current flows from the outside to the central portion of the coil which is formed in a spiral shape. The winding direction of the second coil (c2) is counterclockwise. The input current flows counterclockwise through the second coil (c2). Then, the input current reaches the third coil (c3) via the second through-hole conductor (t2). Thereafter, the input current flows through the third coil (c3). In the third coil (c3), the current flows from the central portion of the coil which is formed in a spiral shape toward outside. The winding direction of the third coil (c3) is counterclockwise. The input current flows counterclockwise through the third coil (c3). Thereafter, the input current reaches the second connection wire (i2). Thereafter, the input current flows through the third coil (c3) and reaches the third through-hole conductor (t3). The second connection wire (i2) is formed on the first surface (F)) of the first coil substrate (D1). In the third coil (c3), the current flows from the outside to the central portion of the coil which is formed in a spiral shape. The winding direction of the third coil (c3) is clockwise. The input current flows clockwise through the third coil (c3). Thereafter, the input current passes through the third through-hole conductor (t3) and reaches the fifth coil (c5). Then, the input current reaches the third connection wire (i3) (is) via the fifth coil (c5). In the fifth coil (c5), the input current flows from the central portion of the coil toward outside. The winding direction of the fifth coil (c5) is clockwise. The input current flows clockwise through the fifth coil (c5). The third connection wire (i3) (is) is formed on the second surface (S) of the first coil substrate (D1) and the second surface (S) of the second coil substrate (D2). The third connection wire (i3) (is) extends from the first coil substrate (D1) to the second coil substrate (D2). Via the third connection wire (i3) (is), the input current reaches the sixth coil (c6). The input current reaches the fourth through-hole conductor (t4) via the sixth coil (c6). In the sixth coil (c6), the input current flows from the outside toward the central portion of the coil. The winding direction of the sixth coil (c6) is counterclockwise. The input current flows counterclockwise through the sixth coil (c6). Then, via the fourth through-hole conductor (t4), the input current reaches the seventh coil (c7). In the seventh coil (c7), the input current flows from the central portion of the coil toward outside. The winding direction of the seventh coil (c7) is counterclockwise. The input current flows counterclockwise through the seventh coil (c7). Then, the input current reaches the fourth connection wire (i4). The fourth connection wire (i4) is formed on the first surface (F)) of the second coil substrate (D2). Via the fourth connection wire (i4), the input current reaches the eighth coil (c8). Thereafter, the input current reaches the fifth through-hole conductor (t5) via the eighth coil (c8). In the eighth coil (c8), the input current flows from the outside toward the central portion of the coil. The winding direction of the eighth coil (c8) is clockwise. The input current flows clockwise through the eighth coil (c8). Via the fifth through-hole conductor (t5), the input current reaches the ninth coil (c9). Thereafter, the input current reaches the fifth connection wire (i5) via the ninth coil (c9). In the ninth coil (c9), the input current flows from the central portion of the coil toward outside. The winding direction of the ninth coil (c9) is clockwise. The input current flows clockwise through the ninth coil (c9). The fifth connection wire (i5) is formed on the second surface (S) of the second coil substrate (D2). The input current reaches the tenth coil (c10) from the fifth connection wire (i5). Via the tenth coil (c10) which is formed on the second surface (S) of the second coil substrate (D2), the input current reaches the sixth through-hole conductor (t6). In the tenth coil (c10), the input current flows from the outside toward the central portion of the coil. The winding direction of the tenth coil (c10) is counterclockwise. The input current flows counterclockwise through the tenth coil (c10). Via the sixth through-hole conductor (t6), the input current reaches the eleventh coil (c11). Thereafter, the input current reaches the sixth connection wire (i6) (if) via the eleventh coil (c11). In the eleventh coil (c11), the current flows from the central portion of the coil toward outside. The winding direction of the eleventh coil (c11) is counterclockwise. The input current flows counterclockwise through the eleventh coil (c11). Then, the input current reaches the twelfth coil (c12) via the sixth connection wire (i6) (if). The sixth connection wire (i6) (if) is formed on the first surface (F) of the second coil substrate (D2) and the first surface (F) of the third coil substrate (D3). The sixth connection wire (i6) (if) extends from the second coil substrate (D2) to the third coil substrate (D3). The input current output from the sixth connection wire (i6) (if) reaches the seventh through-hole conductor (t7) via the twelfth coil (c12). In the twelfth coil (c12), the input current flows from the outside toward the central portion of the coil. The winding direction of the twelfth coil (c12) is clockwise. The input current flows clockwise through the twelfth coil (c12). Then, the input current reaches the thirteenth coil (c13) via the seventh through-hole conductor (t7). Then, the input current reaches the seventh connection wire (i7) via the thirteenth coil (c13). In the thirteenth coil (c13), the input current flows from the central portion of the coil toward outside. The winding direction of the thirteenth coil (c13) is clockwise. The input current flows clockwise through the thirteenth coil (c13). The seventh connection wire (i7) is formed on the second surface (S) of the third coil substrate (D3). The input current output from the seventh connection wire (i7) reaches the fourteenth coil (c14). Thereafter, the input current reaches the eighth through-hole conductor (t8) formed at the central portion of the fourteenth coil (c14). In the fourteenth coil (c14), the current flows from the outside toward the central portion of the coil. The winding direction of the fourteenth coil (c14) is counterclockwise. The input current flows counterclockwise through the fourteenth coil (c14). The input current reaches the fifteenth coil (c15) via the eighth through-hole conductor (t8). Thereafter, the input current reaches the eighth connection wire (i8) via the fifteenth coil (c15). In the fifteenth coil (c15), the input current flows from the central portion of the coil toward outside. The winding direction of the fifteenth coil (c15) is counterclockwise. The input current flows counterclockwise through the fifteenth coil (c15). The eighth connection wire (i8) is formed on the first surface (F)) of the third coil substrate (D3). The input current output from the eighth connection wire (i8) reaches the ninth through-hole conductor (t9) via the sixteenth coil (c16). In the sixteenth coil (c16), the input current flows from the outside toward the central portion of the coil. The winding direction of the sixteenth coil (c16) is clockwise. The input current flows clockwise through the sixteenth coil (c16). Thereafter, the input current reaches the seventeenth coil (c17) via the ninth through-hole conductor (t9). Then, the input current reaches the ninth connection wire (i9) (is) via the seventeenth coil (c17). In the seventeenth coil (c17), the input current flows from the central portion of the coil toward outside. The winding direction of the seventeenth coil (c17) is clockwise. The input current flows clockwise through the seventeenth coil (c17). The ninth connection wire (i9) (is) is formed on the second surface (S) of the third coil substrate (D3) and the second surface (S) of the fourth coil substrate (D4). The ninth connection wire (i9) (is) extends from the third coil substrate (D3) to the fourth coil substrate (D4). The input current output from the ninth connection wire (i9) (is) reaches the tenth through-hole conductor (t10) via the eighteenth coil (c18). In the eighteenth coil (c18), the input current flows from the outside toward the central portion of the coil. The winding direction of the eighteenth coil (c18) is counterclockwise. The input current flows counterclockwise through the eighteenth coil (c18). Then, the input current reaches the nineteenth coil (c19) via the tenth through-hole conductor (t10). Thereafter, the input current reaches the tenth connection wire (i10) via the nineteenth coil (c19). In the nineteenth coil (c19), the input current flows from the central portion of the coil toward outside. The winding direction of the nineteenth coil (c19) is counterclockwise. The input current flows counterclockwise through the nineteenth coil (c19). The tenth connection wire (i10) is formed on the first surface (F)) of the fourth coil substrate (D4). The input current output from the tenth connection wire (i10) reaches the eleventh through-hole conductor (t11) via the twentieth coil (c20). In the twentieth coil (c20), the input current flows from the outside toward the central portion of the coil. The winding direction of the twentieth coil (c20) is clockwise. The input current flows clockwise through the twentieth coil (c20). Via the eleventh through-hole conductor (t11), the input current reaches the twenty-first coil (c21). Then, the input current reaches the eleventh connection wire (i11) via the twenty-first coil (c21). In the twenty-first coil (c21), the input current flows from the central portion of the coil toward outside. The winding direction of the twenty-first coil (c21) is clockwise. The input current flows clockwise through the twenty-first coil (c21). The eleventh connection wire (i11) is formed on the second surface (S) of the fourth coil substrate (D4). The input current output from the eleventh connection wire (i11) reaches the twelfth through-hole conductor (t12) via the twenty-second coil (c22). In the twenty-second coil (c22), the input current flows from the outside toward the central portion of the coil. The winding direction of the twenty-second coil (c22) is counterclockwise. The input current flows counterclockwise through the twenty-second coil (c22). The input current reaches the twenty-third coil (c23) via the twelfth through-hole conductor (t12). Thereafter, the input current reaches the twelfth connection wire (i12) via the twenty-third coil (c23). In the twenty-third coil (c23), the input current flows from the central portion of the coil toward outside. The winding direction of the twenty-third coil (c23) is counterclockwise. The input current flows counterclockwise through the twenty-third coil (c23). The twelfth connection wire (i12) is formed on the first surface (F)) of the fourth coil substrate (D4). The input current output from the twelfth connection wire (i12) reaches the thirteenth through-hole conductor (t13) via the twenty-fourth coil (c24). In the twenty-fourth coil (c24), the input current flows from the outside toward the central portion of the coil. The winding direction of the twenty-fourth coil (c24) is clockwise. The input current flows clockwise through the twenty-fourth coil (c24). Then, the input current reaches the twenty-fifth coil (c25) via the thirteenth through-hole conductor (t13). Thereafter, the input current reaches the thirteenth connection wire (i13) via the twenty-fifth coil (c25). In the twenty-fifth coil (c25), the input current flows from the central portion of the coil toward outside. The winding direction of the twenty-fifth coil (c25) is clockwise. The input current flows clockwise through the twenty-fifth coil (c25). The thirteenth connection wire (i13) is formed on the second surface (S) of the fourth coil substrate (D4). The input current output from the thirteenth connection wire (i13) reaches the fourteenth through-hole conductor (t14) via the twenty-sixth coil (c26). In the twenty-sixth coil (c26), the input current flows from the outside toward the central portion of the coil. The winding direction of the twenty-sixth coil (c26) is counterclockwise. The input current flows counterclockwise through the twenty-sixth coil (c26). Via the fourteenth through-hole conductor (t14), the input current reaches the twenty-seventh coil (c27). Thereafter, the input current reaches the fourteenth connection wire (i14) via the twenty-seventh coil (c27). In the twenty-seventh coil (c27), the input current flows from the central portion of the coil toward outside. The winding direction of the twenty-seventh coil (c27) is counterclockwise. The input current flows counterclockwise through the twenty-seventh coil (c27). The fourteenth connection wire (i14) is formed on the first surface (F)) of the fourth coil substrate (D4). The input current output from the fourteenth connection wire (i14) reaches the fifteenth through-hole conductor (t15) via the twenty-eighth coil (c28). In the twenty-eighth coil (c28), the input current flows from the outside toward the central portion of the coil. The winding direction of the twenty-eighth coil (c28) is clockwise. The input current flows clockwise through the twenty-eighth coil (c28). Via the fifteenth through-hole conductor (t15), the input current reaches the twenty-ninth coil (c29). Then, the input current reaches the fifteenth connection wire (i15) (is) via the twenty-ninth coil (c29). In the twenty-ninth coil (c29), the input current flows from the central portion of the coil toward outside. The winding direction of the twenty-ninth coil (c29) is clockwise. The input current flows clockwise through the twenty-ninth coil (c29). The fifteenth connection wire (i15) (is) is formed on the second surface (S) of the fourth coil substrate (D4) and the second surface (S) of the third coil substrate (D3). The fifteenth connection wire (i15) (is) extends from the fourth coil substrate (D4) to the third coil substrate (D3). The input current output from the fifteenth connection wire (i15) (is) reaches the sixteenth through-hole conductor (t16) via the thirtieth coil (c30). In the thirtieth coil (c30), the input current flows from the outside toward the central portion of the coil. The winding direction of the thirtieth coil (c30) is counterclockwise. The input current flows counterclockwise through the thirtieth coil (c30). Thereafter, the input current reaches the thirty-first coil (c31) via the sixteenth through-hole conductor (t16). Then, the input current reaches the sixteenth connection wire (i16) via the thirty-first coil (c31). In the thirty-first coil (c31), the input current flows from the central portion of the coil toward outside. The winding direction of the thirty-first coil (c31) is counterclockwise. The input current flows counterclockwise through the thirty-first coil (c31). The input current output from the sixteenth connection wire (i16) reaches the seventeenth through-hole conductor (t17) via the thirty-second coil (c32). In the thirty-second coil (c32), the input current flows from the outside toward the central portion of the coil. The winding direction of the thirty-second coil (c32) is clockwise. The input current flows clockwise through the thirty-second coil (c32). Via the seventeenth through-hole conductor (t17), the input current reaches the thirty-third coil (c33). Thereafter, the input current reaches the seventeenth connection wire (i17) via the thirty-third coil (c33). In the thirty-third coil (c33), the input current flows from the central portion of the coil toward outside. The winding direction of the thirty-third coil (c33) is clockwise. The input current flows clockwise through the thirty-third coil (c33). The seventeenth connection wire (i17) is formed on the second surface (S) of the third coil substrate (D3). The input current output from the seventeenth connection wire (i17) reaches the eighteenth through-hole conductor (t18) via the thirty-fourth coil (c34). In the thirty-fourth coil (c34), the input current flows from the outside toward the central portion of the coil. The winding direction of the thirty-fourth coil (c34) is counterclockwise. The input current flows counterclockwise through the thirty-fourth coil (c34). Via the eighteenth through-hole conductor (t18), the input current reaches the thirty-fifth coil (c35). The input current reaches the eighteenth connection wire (i18) (if) via the thirty-fifth coil (c35). In the thirty-fifth coil (c35), the input current flows from the central portion of the coil toward outside. The winding direction of the thirty-fifth coil (c35) is counterclockwise. The input current flows counterclockwise through the thirty-fifth coil (c35). The eighteenth connection wire (i18) (if) is formed on the first surface (F) of the third coil substrate (D3) and the first surface (F) of the second coil substrate (D2). The eighteenth connection wire (i18) (if) extends from the third coil substrate (D3) to the second coil substrate (D2). The input current output from the eighteenth connection wire (i18) (if) reaches the nineteenth through-hole conductor (t19) via the thirty-sixth coil (c36). In the thirty-sixth coil (c36), the input current flows from the outside toward the central portion of the coil. The winding direction of the thirty-sixth coil (c36) is clockwise. The input current flows clockwise through the thirty-sixth coil (c36). Via the nineteenth through-hole conductor (t19), the input current reaches the thirty-seventh coil (c37). The input current reaches the nineteenth connection wire (i19) via the thirty-seventh coil (c37). In the thirty-seventh coil (c37), the input current flows from the central portion of the coil toward outside. The winding direction of the thirty-seventh coil (c37) is clockwise. The input current flows clockwise through the thirty-seventh coil (c37). The nineteenth connection wire (i19) is formed on the second surface (S) of the second coil substrate (D2). The input current output from the nineteenth connection wire (i19) reaches the twentieth through-hole conductor (t20) via the thirty-eighth coil (c38). In the thirty-eighth coil (c38), the input current flows from the outside toward the central portion of the coil. The winding direction of the thirty-eighth coil (c38) is counterclockwise. The input current flows counterclockwise through the thirty-eighth coil (c38). The input current reaches the thirty-ninth coil (c39) via the twentieth through-hole conductor (t20). The input current reaches the twentieth connection wire (i20) via the thirty-ninth coil (c39). In the thirty-ninth coil (c39), the input current flows from the central portion of the coil toward outside. The winding direction of the thirty-ninth coil (c39) is counterclockwise. The input current flows counterclockwise through the thirty-ninth coil (c39). The twentieth connection wire (i20) is formed on the first surface (F)) of the second coil substrate (D2). The input current output from the twentieth connection wire (i20) reaches the twenty-first through-hole conductor (t21) via the fortieth coil (c40). The winding direction of the fortieth coil (c40) is clockwise. The input current flows clockwise through the fortieth coil (c40). The input current reaches the forty-first coil (c41) via the twenty-first through-hole conductor (t21). The input current reaches the twenty-first connection wire (i21) (is) via the forty-first coil (c41). In the forty-first coil (c41), the input current flows from the central portion of the coil toward outside. The winding direction of the forty-first coil (c41) is clockwise. The input current flows clockwise through the forty-first coil (c41). The twenty-first connection wire (i21) (is) is formed on the second surface (S) of the second coil substrate (D2) and the second surface (S) of the first coil substrate (D1). The twenty-first connection wire (i21) (is) extends from the second coil substrate (D2) to the first coil substrate (D1). The input current output from the twenty-first connection wire (i21) (is) reaches the twenty-second through-hole conductor (t22) via the forty-second coil (c42). In the forty-second coil (c42), the current flows from the outside toward the central portion of the coil. The winding direction of the forty-second coil (c42) is counterclockwise. The input current flows counterclockwise through the forty-second coil (c42). Via the twenty-second through-hole conductor (t22), the input current reaches an output (out1) formed on the first surface (F) of the first coil substrate (D1).

The printed wiring board 100 of FIG. 1 is for an exemplary purpose. Some of the coils (C) can be removed from the printed wiring board 100 of FIG. 1. Some of the through-hole conductors (T) can be removed from the printed wiring board 100 of FIG. 1. Some of the connection wires (i) can be removed from the printed wiring board 100 of FIG. 1. More coil substrates (D), coils (C), through-hole conductors (T) or connection wires (i) can be added to the printed wiring board 100 of FIG. 1. The winding directions of the coils and the directions of the currents flowing through the coils in the printed wiring board 100 are observed from a position above the first surface (F) of the printed wiring board 100.

When such a printed wiring board is folded, in the laminated coil substrate, the winding directions of two coils opposing each other via the resin substrate 101, or the winding directions of two coils opposing each other via an adhesive layer 22 are the same. Therefore, the currents flow in the same direction in the two coils opposing each other via the resin substrate 101. The currents flow in the same direction in the two coils opposing each other via an adhesive layer 22. Performance of the laminated coil substrate can be increased.

As illustrated in FIG. 1, the laminated coil substrate 10 of the first embodiment has the connection wires (connection wirings) connecting adjacent coils. Among the multiple connection wires, some connection wires each connect a coil formed on one coil substrate to a coil formed on another coil substrate. Such connection wires are referred to as intersubstrate connection wires (if, is). Due to that the laminated coil substrate 10 of the first embodiment has the intersubstrate connection wires (if, is), for example, the number of through-hole conductors can be reduced.

In the first embodiment, an adhesive layer 22 is sandwiched between one coil substrate having coils and another coil substrate having coils. One coil substrate having coils and another coil substrate having coils are bonded to each other by an adhesive layer 22. One coil substrate and another coil substrate are adjacent to each other via an adhesive layer 22. Then, coils formed on one coil substrate and coils formed on another coil substrate are connected to each other by the intersubstrate connection wires (if, is). Coils formed on one coil substrate and coils (C) formed on another coil substrate are connected to each other only by the intersubstrate connection wires (if, is). In that case, a through hole for a through-hole conductor is not formed in the adhesive layer 22. An adhesive force of the adhesive layer can be increased. Insulation resistance between coils sandwiching an adhesive layer can be increased. Warpage of the laminated coil substrate can be reduced. A through hole for a through-hole conductor is not formed in the magnetic sheet 24. For example, a torque of the laminated coil substrate can be increased. Insulation resistance between the coils sandwiching the magnetic sheet can be increased. The number of the intersubstrate connection wires (if, is) connecting adjacent coil substrates to each other is preferably 2. In FIG. 1, the number of the intersubstrate connection wires (is) connecting to each other the first coil substrate (D1) and the second coil substrate (D2), which are adjacent to each other, is 2. The second coil substrate (D2) and the third coil substrate (D3) are also connected to each other by two intersubstrate connection wires (if). The third coil substrate (D3) and the fourth coil substrate (D4) are also connected to each other by two intersubstrate connection wires (is).

Figure 4:
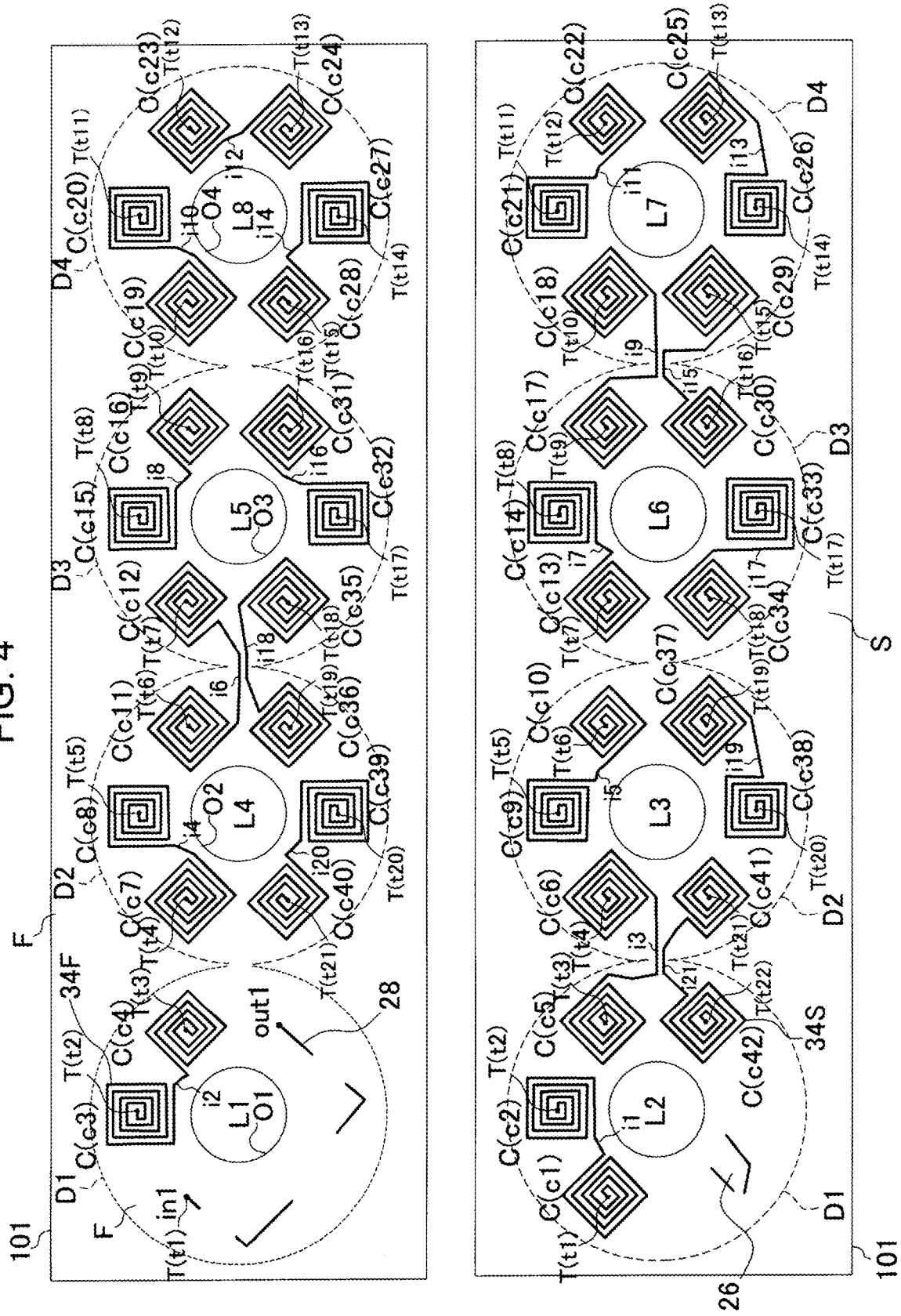
FIG. 4 illustrates a method for manufacturing the printed wiring board for forming the laminated coil substrate according to the first embodiment.

FIG. 4 illustrates a method for manufacturing the printed wiring board 100 of the first embodiment.

The resin substrate 101 having the first surface (F) and the second surface (S) that is on an opposite side with respect to the first surface (F) is prepared. The resin substrate 101 is a flexible substrate of polyimide or the like. In FIG. 4, the resin substrate 101 is formed to include four areas. The first area is formed by the first coil substrate (D1), the second area is formed by the second coil substrate (D2), the third area is formed by a third coil substrate (D3), and the fourth area is formed by the fourth coil substrate (D4). The first coil substrate (D1), the second coil substrate (D2), the third coil substrate (D3) and the fourth coil substrate (D4) are continuous. These coil substrates are connected.

The first conductor layer (34F) is formed on the first surface (F) of the resin substrate 101. The second conductor layer (34S) is formed on the second surface (S) of the resin substrate 101. The through-hole conductors (T) penetrating the resin substrate 101 and connecting the first conductor layer (34F) and the second conductor layer (34S) to each other are formed.

The first conductor layer (34F) includes the first coil layer (L1) on the first surface (F) of the first coil substrate (D1), the fourth coil layer (L4) on the first surface (F) of the second coil substrate (D2), the fifth coil layer (L5) on the first surface (F) of the third coil substrate (D3), and the eighth coil layer (L8) on the first surface (F) of the fourth coil substrate (D4). The first coil layer (L1) includes the wiring 28, the coils (C) and the connection wire (i). The fourth coil layer (L4) includes the coils (C) and the connection wires (i). The fifth coil layer (L5) includes the coils (C) and the connection wires (i). The eighth coil layer (L8) includes the coils (C) and the connection wires (i).

The second conductor layer (34S) includes the second coil layer (L2) on the second surface (S) of the first coil substrate (D1), the third coil layer (L3) on the second surface (S) of the second coil substrate (D2), the sixth coil layer (L6) on the second surface (S) of the third coil substrate (D3), and the seventh coil layer (L7) on the second surface (S) of the fourth coil substrate (D4). The second coil layer (L2) includes the wiring 26, the coils (C) and the connection wires (i). The third coil layer (L3) includes the coils (C) and the connection wires (i). The sixth coil layer (L6) includes the coils (C) and the connection wires (i). The seventh coil layer (L7) includes the coils (C) and the connection wires (i).

Then, the resin substrate 101 is cut along a dotted line in FIG. 4. By the cutting, the printed wiring board 100 formed by the four disk-shaped substrates (the first coil substrate (D1), the second coil substrate (D2), the third coil substrate (D3), and the fourth coil substrate (D4)) is formed. An opening (O1) is formed at a center of the first coil substrate (D1). An opening (O2) is formed at a center of the second coil substrate (D2). An opening (O3) is formed at a center of the third coil substrate (D3). An opening (O4) is formed at a center of the fourth coil substrate (D4). The printed wiring board 100 illustrated in FIG. 3A is manufactured. In the printed wiring board 100, adjacent coil substrates (D) are connected to each other. Then, the printed wiring board 100 is folded such that adjacent coil substrates overlap each other (FIG. 3B). In this case, an adhesive layer 22 is sandwiched between each pair of adjacent coil substrates. At least one of the adhesive layers 22 is formed of a magnetic sheet 24. In FIG. 3C, the magnetic sheet 24 is formed between the second coil substrate (D2) and the third coil substrate (D3). The coil substrates (C) and the adhesive layers 22 are integrated, for example, by hot pressing. The laminated coil substrate 10 illustrated in FIG. 3C is completed.

According to the laminated coil substrate 10 of the first embodiment, the connection between the coil substrates (D) is performed using the connection wires (if, is). Therefore, connection reliability between the coil substrates can be increased. Through-hole conductors penetrating the adhesive layers 22 can be eliminated. The laminated coil substrate 10 can be manufactured by folding the printed wiring board 100. The manufacturing method can be simplified.

As illustrated in FIG. 3C, a magnet 30 is placed below the laminated coil substrate 10. The magnet 30 may be placed directly below the laminated coil substrate 10. The magnet 30 is formed by a first magnet (M1), a second magnet (M2), a third magnet (M3), a fourth magnet (M4), a fifth magnet (M5) and a sixth magnet (M6). An upper surface of the first magnet (M1) is an S pole; an upper surface of the second magnet (M2) is an N pole; an upper surface of the third magnet (M3) is an S pole; an upper surface of the fourth magnet (M4) is an N pole; an upper surface of the fifth magnet (M5) is an S pole; and an upper surface of the sixth magnet (M6) is an N pole. Further, a disk-shaped iron plate 40 is placed directly below the magnet 30.

An example of a relationship between a winding direction of a coil and a flow direction of a current flowing through the coil is described as follows.

The directions of currents flowing through the coils (C) and the winding directions of the coils (C) are related. When a winding direction of a coil is clockwise, a current flows clockwise through the coil. When a winding direction of a coil is counterclockwise, a current flows counterclockwise through the coil.

The opening (O1) is formed at the central area of the first coil substrate (D1). The opening (O2) is formed at the central area of the second coil substrate (D2). The opening (O3) is formed at the central area of the third coil substrate (D3). The opening (O4) is formed at the central area of the fourth coil substrate (D4). A shaft of a fan motor is inserted into the openings (O1, O2, O3, O4).

Second Embodiment

Figure 6:
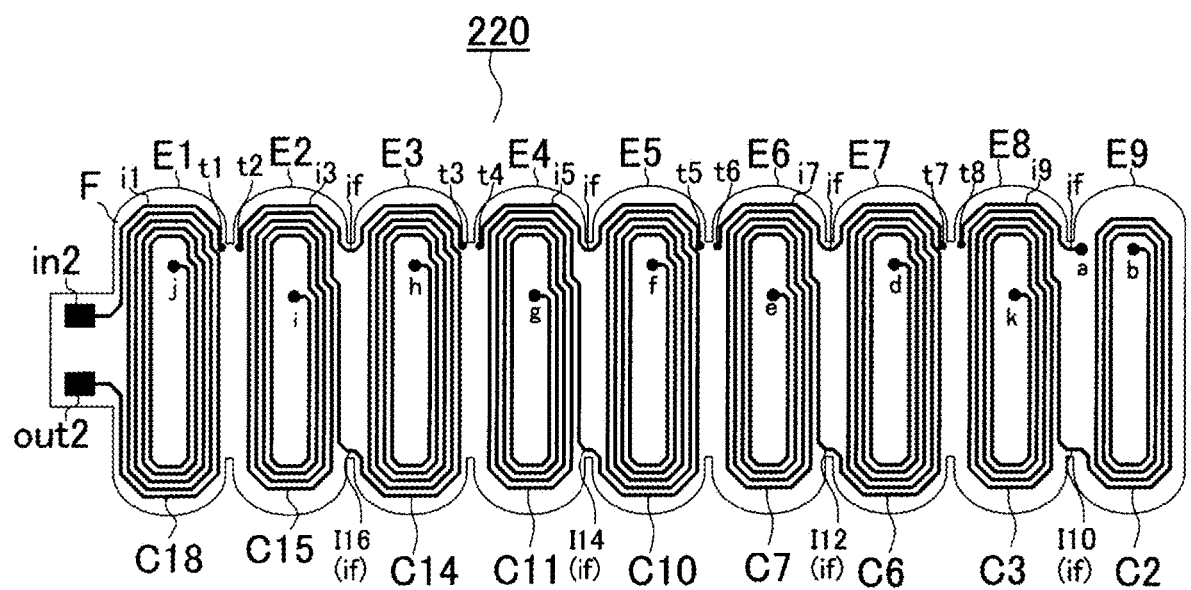
FIG. 6 is a plan view and a bottom view of a resin substrate that forms a coil according to a second embodiment of the present invention.
Figure 6:
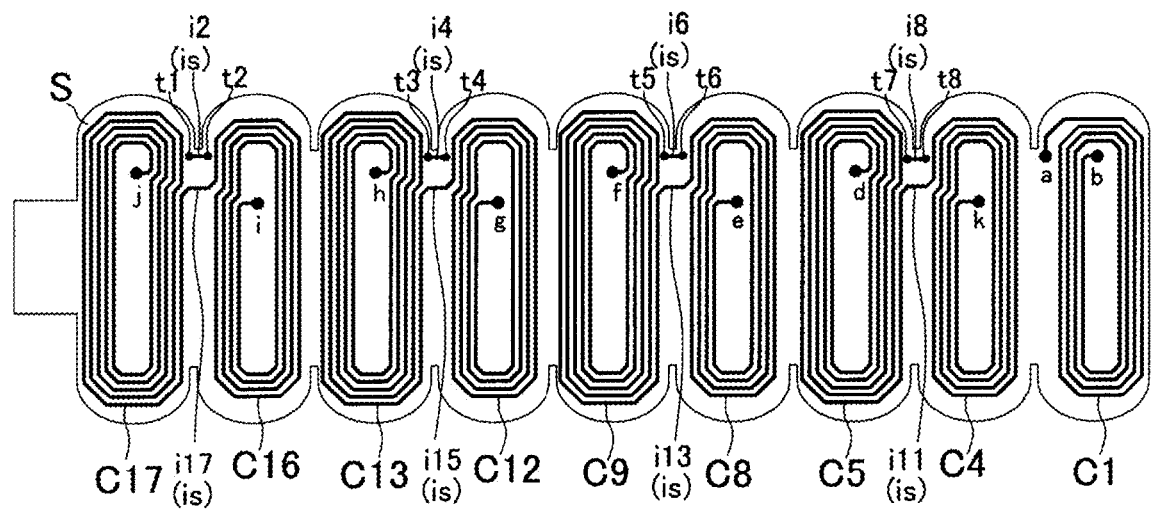

FIG. 6 is a plan view and a bottom view of a resin substrate 220 that forms a coil according to a second embodiment of the present invention. The resin substrate 220 is formed by a series of 9 connected oval-shaped coil substrates including a first coil substrate (E1), a second coil substrate (E2), a third coil substrate (E3), a fourth coil substrate (E4), a fifth coil substrate (E5), a sixth coil substrate (E6), a seventh coil substrate (E7), an eighth coil substrate (E8), and a ninth coil substrate (E9), and is folded in a zigzag shape in the same was as in the first embodiment to form a coil. A magnetic sheet is provided between the folded coil substrates. A pair of coils of the second embodiment is used as a vibration motor (vibrator) of a mobile phone.

An eighteenth coil (C18) is formed on a front surface (first surface) (F) of the first coil substrate (E1). A seventeenth coil (C17) is formed on a back surface (second surface) (S) of the first coil substrate (E1). An input (in2) and an output (out2) are formed on the first surface (F) of the first coil substrate (E1). A fifteenth coil (C15) is formed on a first surface (F) of the second coil substrate (E2), and a sixteenth coil (C16) is formed on a second surface (S) of the second coil substrate (E2). A fourteenth coil (C14) is formed on a first surface (F) of the third coil substrate (E3), and a thirteenth coil (C13) is formed on a second surface (S) of the third coil substrate (E3). An eleventh coil (C11) is formed on a first surface (F) of the fourth coil substrate (E4), and a twelfth coil (C12) is formed on a second surface (S) of the fourth coil substrate (E4). A tenth coil (C10) is formed on a first surface (F) of the fifth coil substrate (E5), and a ninth coil (C9) is formed on a second surface (S) of the fifth coil substrate (E5). A seventh coil (C7) is formed on a first surface (F) of the sixth coil substrate (E6), and an eighth coil (C8) is formed on a second surface (S) of the sixth coil substrate (E6). A sixth coil (C6) is formed on a first surface (F) of the seventh coil substrate (E7), and a fifth coil (C5) is formed on a second surface (S) of the seventh coil substrate (E7). A third coil (C3) is formed on a first surface (F) of the eighth coil substrate (E8), and a fourth coil (C4) is formed on a second surface (S) of the eighth coil substrate (E8). A second coil (C2) is formed on a first surface (F) of the ninth coil substrate (E9), and a first coil (C1) is formed on a second surface (S) of the ninth coil substrate (E9). The eighteenth coil (C18), the fifteenth coil (C15), the fourteenth coil (C14), the eleventh coil (C11), the tenth coil (C10), the seventh coil (C7), the sixth coil (C6), the third coil (C3), and the second coil (C2) on the first surface (F) side are each formed in a spiral shape spreading in a clockwise direction. The seventeenth coil (C17), the sixteenth coil (C16), the thirteenth coil (C13), the twelfth coil (C12), the ninth coil (C9), the eighth coil (C8), the fifth coil (C5), the fourth coil (C4), and the first coil (C1) on the second surface (S) side are each formed in a spiral shape spreading in a clockwise direction. The seventeenth coil (C17), the sixteenth coil (C16), the thirteenth coil (C13), the twelfth coil (C12), the ninth coil (C9), the eighth coil (C8), the fifth coil (C5), the fourth coil (C4), and the first coil (C1) on the second surface (S) side are each wound counterclockwise in FIG. 6, but are each wound clockwise when viewed from the first surface (F) side.

A current from the input (in2) provided on the first surface (F) of the first coil substrate (E1) reaches a first through-hole conductor (t1) via a first connection wire (i1). Via the first through-hole conductor (t1), the current passes through a second connection wire (i2) (is) provided on the second surface (S) side and reaches a second through-hole conductor (t2). Via the second through-hole conductor (t2), the current passes through a third connection wire (i3) provided on the first surface (F) side and reaches a third through-hole conductor (t3). The third connection wire (i3) forms an intersubstrate connection wire (if) at a connecting part between the second coil substrate (E2) and the third coil substrate (E3). Via the third through-hole conductor (t3), the current passes through a fourth connection wire (i4) (intersubstrate connection wire (is)) provided on the second surface (S) side and reaches a fourth through-hole conductor (t4). Via the fourth through-hole conductor (t4), the current passes through a fifth connection wire (i5) provided on the first surface (F) side and reaches a fifth through-hole conductor (t5). The fifth connection wire (i5) forms an intersubstrate connection wire (if) at a connecting part between the fourth coil substrate (E4) and the fifth coil substrate (E5). Via the fifth through-hole conductor (t5), the current passes through a sixth connection wire (i6) (intersubstrate connection wire (is)) provided on the second surface (S) side and reaches a sixth through-hole conductor (t6). Via the sixth through-hole conductor (t6), the current passes through a seventh connection wire (i7) provided on the first surface (F) side and reaches a seventh through-hole conductor (t7). The seventh connection wire (i7) forms an intersubstrate connection wire (if) at a connecting part between the sixth coil substrate (E6) and the seventh coil substrate (E7). Via the seventh through-hole conductor (t7), the current passes through an eighth connection wire (i8) (intersubstrate connection wires (is)) provided on the second surface (S) side and reaches an eighth through-hole conductor (t8). Via the eighth through-hole conductor (t8), the current passes through a ninth connection wire (i9) provided on the first surface (F) side and reaches an A through-hole conductor (a). The ninth connection wire (i9) forms an intersubstrate connection wire (if) at a connecting part between the eighth coil substrate (E8) and the ninth coil substrate (E9).

Via the ninth connection wire (i9), the current passes through the A through-hole conductor (a) of the ninth coil substrate (E9), and, via the first coil (C1) on the second surface (S) side of the ninth coil substrate (E9), reaches a B through-hole conductor (b). The current passes from the B through-hole conductor (b) through the second coil (C2) on the first surface (F) side, and, via a connection wire (i10) (if), passes through the third coil (C3) of the eighth coil substrate (E8) and reaches a K through-hole conductor (k). The current passes from the K through-hole conductor (k) through the fourth coil (C4) on the second surface (S) side, and, via a connection wire (i11) (is), passes through the fifth coil (C5) of the seventh coil substrate (E7) and reaches a D through-hole conductor (d). The current passes from the D through-hole conductor (d) through the sixth coil (C6) on the first surface (F) side, and, via a connection wire (i12) (if), passes through the seventh coil (C7) of the sixth coil substrate (E6) and reaches an E through-hole conductor (e). The current passes from the E through-hole conductor (e) through the eighth coil (C8) on the second surface (S) side, and, via a connection wire (i13) (is), passes through the ninth coil (C9) of the fifth coil substrate (E5) and reaches an F through-hole conductor (f). The current passes from the F through-hole conductor (f) through the tenth coil (C10) on the first surface (F) side, and, via a connection wire (i14) (if), passes through the eleventh coil (C11) of the fourth coil substrate (E4) and reaches a G through-hole conductor (g). The current passes from the G through-hole conductor (g) through the twelfth coil (C12) on the second surface (S) side, and, via a connection wire (i15) (is), passes through the thirteenth coil (C13) of the third coil substrate (E3) and reaches an H through-hole conductor (h). The current passes from the H through-hole conductor (h) through the fourteenth coil (C14) on the first surface (F) side, and, via a connection wire (i16) (if), passes through the fifteenth coil (C15) of the second coil substrate (E2) and reaches an I through-hole conductor (i). The current passes from the I through-hole conductor (i) through the sixteenth coil (C16) on the second surface (S) side, and, via a connection wire (i17) (is), passes through the seventeenth coil (C17) of the first coil substrate (E1) and reaches a J through-hole conductor (j). The current passes from the J through-hole conductor (j) through the eighteenth coil (C18) on the first surface (F) side and reaches the output (out2).

According to the coil of the second embodiment, the spiral-shaped eighteenth coil (C18), fifteenth coil (C15), fourteenth coil (C14), eleventh coil (C11), tenth coil (C10), seventh coil (C7), sixth coil (C6), third coil (C3), and second coil (C2) are formed on the first surface (F) of the resin substrate 220, and the spiral-shaped seventeenth coil (C17), sixteenth coil (C16), thirteenth coil (C13), twelfth coil (C12), ninth coil (C9), eighth coil (C8), fifth coil (C5), fourth coil (C4), and first coil (C1) are formed on the second surface (S) of the resin substrate 220. Therefore, the coil of the second embodiment can be easily manufactured as compared to a coil having a laminated structure. Further, since the coil of the second embodiment is formed from the one-layer resin substrate 220, high reliability can be obtained. Further, since each coil is formed in a spiral shape, the number of turns of the coil is large, and a high inductance can be achieved, and the coil can be used for driving a vibrator.

The intersubstrate connection wires (is) are respectively provided on the second surface (S) side between the first coil substrate (E1) and the second coil substrate (E2), between the third coil substrate (E3) and the fourth coil substrate (E4), between the fifth coil substrate (E5) and the sixth coil substrate (E6), and between the seventh coil substrate (E7) and the eighth coil substrate (E8), each pair of the coil substrates being folded in a mountain shape. The intersubstrate connection wires (is) are formed on the second surface (S), that is, on an inner side of the folded resin substrate. Therefore, the intersubstrate connection wires (is) receive a small stress when being folded, and a disconnection is unlikely to occur.

The intersubstrate connection wires (if) are respectively provided on the first surface (F) side between the second coil substrate (E2) and the third coil substrate (E3), between the fourth coil substrate (E4) and the fifth coil substrate (E5), between the sixth coil substrate (E6) and the seventh coil substrate (E7), and between the eighth coil substrate (E8) and the ninth coil substrate (E9), each pair of the coil substrates being folded in a valley shape. The intersubstrate connection wires (if) are formed on the first surface (F), that is, on an inner side of the folded resin substrate. Therefore, the intersubstrate connection wires (if) receive a small stress when being folded, and a disconnection is unlikely to occur.

In Japanese Patent Laid-Open Publication No. 2002-289984, the double-sided flexible substrate is bent at a substantially right angle. Here, when a double-sided flexible substrate is folded, it is thought that, even when a reinforcing cover lay is used, a circuit pattern at a folded portion cannot be reinforced and a disconnection occurs.

A laminated coil substrate according to an embodiment of the present invention is formed by folding a printed wiring board which is formed by a resin substrate having a first surface and a second surface on an opposite side with respect to the first surface, a first conductor layer forming coils on the first surface, and a second conductor layer forming coils on the second surface. The printed wiring board includes a first coil substrate, a second coil substrate, and a third coil substrate. The printed wiring board is folded such that the second surface of the first coil substrate and the second surface of the second coil substrate oppose each other. The printed wiring board is folded such that the first surface of the second coil substrate and the first surface of the third coil substrate oppose each other. A connection wire between the first coil substrate and the second coil substrate is formed on the second surface. A connection wire between the second coil substrate and the third coil substrate is formed on the first surface.

A printed wiring board according to an embodiment of the present invention is folded such that the second surface of the first coil substrate and the second surface of the second coil substrate oppose each other, and the connection wire between the first coil substrate and the second coil substrate is formed on the second surface, that is, on an inner side of the folded resin substrate. Therefore, a stress received during folding is small, and a disconnection is unlikely to occur. The printed wiring board is folded such that the first surface of the second coil substrate and the first surface of the third coil substrate oppose each other, and the connection wire between the second coil substrate and the third coil substrate is formed on the first surface, that is, on an inner side of the folded resin substrate. Therefore, a stress received during folding is small, and a disconnection is unlikely to occur.

Obviously, numerous modifications and variations of the present invention are possible in light of the above teachings. It is therefore to be understood that within the scope of the appended claims, the invention may be practiced otherwise than as specifically described herein.

The invention claimed is:

1. A laminated coil substrate, comprising:
   a printed wiring board comprising a resin substrate, a first conductor layer formed on a first surface of the resin substrate and comprising a plurality of coils, and a second conductor layer formed on a second surface of the resin substrate on an opposite side with respect to the first surface and comprising a plurality of coils,
   wherein the printed wiring board includes a first coil substrate, a second coil substrate and a third coil substrate that are folded such that the second surface of the resin substrate in the first coil substrate and the second surface of the resin substrate in the second coil substrate oppose each other and that the first surface of the resin substrate in the second coil substrate and the first surface of the resin substrate in the third coil substrate oppose each other, the second conductor layer of the printed wiring board includes a connection wire formed on the second surface of the resin substrate and connecting the first coil substrate and the second coil substrate, and the first conductor layer of the printed wiring board includes a connection wire formed on the first surface of the resin substrate and connecting the second coil substrate and the third coil substrate.

2. The laminated coil substrate according to claim 1, wherein each of the first coil substrate, the second coil substrate and the third coil substrate has a plurality of coils on the first surface and second surface of the resin substrate, the first conductor layer and the second conductor layer have the connection wires formed in a plurality and connecting the plurality of coils, the printed wiring board has a plurality of through-hole conductors connecting the plurality of coils in the first conductor layer and the plurality of coils in the second conductor layer, and the plurality of coils is formed such that the plurality of coils that are directly connected to each other by the through-hole conductors has same winding directions and that the plurality of coils that are directly connected to each other by the connection wires has winding directions that are different from each other.

3. The laminated coil substrate according to claim 2, wherein each of the first coil substrate, the second coil substrate and the third coil substrate has an even number of the coils formed on the first surface of the resin substrate, and an even number of the coils formed on the second surface of the resin substrate.

4. A motor, comprising:
the laminated coil substrate of claim 1.

5. The motor according to claim 4, wherein the laminated coil substrate further comprises
a plurality of magnetic sheets, and
the printed wiring board has a plurality of coil substrates including the first coil substrate, the second coil substrate, and the third coil substrate such that each of the magnetic sheets is positioned between two opposing coil substrates of the plurality of coil substrates.

6. A coil for a vibration motor, comprising:
the laminated coil substrate of claim 1.

7. The laminated coil substrate according to claim 1, wherein the resin substrate is a flex substrate.

8. The laminated coil substrate according to claim 2, wherein each of the connection wire connecting the first coil substrate and the second coil substrate and the connection wire connecting the second coil substrate and the third coil substrate is formed to have a width in a range of from 45 μm to 500 μm.

9. A motor, comprising:
the laminated coil substrate of claim 2.

10. The motor according to claim 9, wherein the laminated coil surface further comprises
a plurality of magnetic sheets, and
the printed wiring board has a plurality of coil substrates including the first coil substrate, the second coil substrate, and the third coil substrate such that each of the magnetic sheets is positioned between two opposing coil substrates of the plurality of coil substrates.

11. The laminated coil substrate according to claim 2, wherein the resin substrate is a flex substrate.

12. The laminated coil substrate according to claim 1, wherein each of the connection wire connecting the first coil substrate and the second coil substrate and the connection wire connecting the second coil substrate and the third coil substrate is formed to have a width in a range of from 45 μm to 500 μm.

13. A motor, comprising:
the laminated coil substrate of claim 3.

14. The motor according to claim 13, wherein the laminated coil substrate further comprises
a plurality of magnetic sheets, and
the printed wiring board has a plurality of coil substrates including the first coil substrate, the second coil substrate, and the third coil substrate such that each of the magnetic sheets is positioned between two opposing coil substrates of the plurality of coil substrates.

15. The laminated coil substrate according to claim 3, wherein the resin substrate is a flex substrate.

16. The laminated coil substrate according to claim 3, wherein each of the connection wire connecting the first coil substrate and the second coil substrate and the connection wire connecting the second coil substrate and the third coil substrate is formed to have a width in a range of from 45 μm to 500 μm.

17. The laminated coil substrate according to claim 4, wherein the resin substrate is a flex substrate.

18. The laminated coil substrate according to claim 4, wherein each of the connection wire connecting the first coil substrate and the second coil substrate and the connection wire connecting the second coil substrate and the third coil substrate is formed to have a width in a range of from 45 μm to 500 μm.

19. The laminated coil substrate according to claim 5, wherein the resin substrate is a flex substrate.

20. The laminated coil substrate according to claim 5, wherein each of the connection wire connecting the first coil substrate and the second coil substrate and the connection wire connecting the second coil substrate and the third coil substrate is formed to have a width in a range of from 45 μm to 500 μm.

* * * * *